(12) United States Patent
Woodruff et al.

(10) Patent No.: US 6,749,390 B2
(45) Date of Patent: *Jun. 15, 2004

(54) INTEGRATED TOOLS WITH TRANSFER DEVICES FOR HANDLING MICROELECTRONIC WORKPIECES

(75) Inventors: Daniel J. Woodruff, Kalispell, MT (US); Randy Harris, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 25 days.

This patent is subject to a terminal disclaimer.

(21) Appl. No.: 09/875,428

(22) Filed: Jun. 5, 2001

(65) Prior Publication Data

US 2001/0024611 A1 Sep. 27, 2001

Related U.S. Application Data

(63) Continuation-in-part of application No. 09/386,566, filed on Aug. 31, 1999, now Pat. No. 6,318,951, which is a continuation of application No. PCT/US99/15567, filed on Jul. 9, 1999, and a continuation-in-part of application No. 08/990,107, filed on Dec. 15, 1997, now Pat. No. 6,672,820.

(51) Int. Cl.⁷ ............................................... B66C 23/00
(52) U.S. Cl. ................................ 414/744.5; 198/346.2; 74/490.03
(58) Field of Search .......................... 414/744.5, 749.1, 414/941, 416; 74/490.03; 198/346.2

(56) References Cited

U.S. PATENT DOCUMENTS

| | | |
|---|---|---|
| 1,526,644 A | 2/1925 | Phinney |
| 1,881,713 A | 10/1932 | Laukel |
| 2,256,274 A | 9/1941 | Boedecker et al. |
| 4,046,105 A | 9/1977 | Gomez |
| 4,304,641 A | 12/1981 | Grandia et al. |
| 4,451,197 A | 5/1984 | Lange |
| 4,495,453 A | 1/1985 | Inaba et al. |

(List continued on next page.)

FOREIGN PATENT DOCUMENTS

| | | |
|---|---|---|
| WO | WO 00/02808 | 1/2000 |
| WO | WO 00/61498 | 10/2000 |

(List continued on next page.)

OTHER PUBLICATIONS

U.S. patent application Ser. No. 09/679,928, Woodruff et al., filed Oct. 5, 2000.

(List continued on next page.)

Primary Examiner—Donald W. Underwood
(74) Attorney, Agent, or Firm—Perkins Coie LLP

(57) ABSTRACT

Transfer devices for handling microelectronic workpieces, apparatus for processing microelectronic workpieces, and methods for manufacturing and using such transfer devices. One embodiment of a transfer device includes a transport unit configured to move along a linear track and a lift assembly carried by the transport unit. The transfer device can also include an arm assembly having an arm actuator carried by the lift assembly to move along a lift path and an arm carried by the arm actuator to rotate about the lift path. The arm can include a first extension projecting from one side of the lift path and a second extension projecting from another side of the lift path. The arm actuator can rotate the arm about the lift path. The transfer device can also include a first end-effector and a second end-effector. The first end-effector is rotatably coupled to the first section of the arm to rotate about a first rotation axis, and the second end-effector is rotatably coupled to the second extension of the arm to rotate about a second rotation axis. The first and second rotation axes can be generally parallel to the lift path, which itself can be substantially vertical, and the first and second end-effectors can be at different elevations relative to the arm.

11 Claims, 7 Drawing Sheets

U.S. PATENT DOCUMENTS

| | | | |
|---|---|---|---|
| 4,566,847 A | | 1/1986 | Maeda et al. |
| 4,634,503 A | | 1/1987 | Nogavich |
| 4,639,028 A | | 1/1987 | Olson |
| 4,648,944 A | | 3/1987 | George et al. |
| 4,670,126 A | | 6/1987 | Messer et al. |
| 4,760,671 A | * | 8/1988 | Ward .................. 198/346.2 X |
| 4,761,214 A | | 8/1988 | Hinman |
| 4,770,590 A | | 9/1988 | Hugues et al. |
| 4,828,654 A | | 5/1989 | Reed |
| 4,902,398 A | | 2/1990 | Homstad |
| 4,944,650 A | | 7/1990 | Matsumoto |
| 4,949,671 A | | 8/1990 | Davis et al. |
| 4,988,533 A | | 1/1991 | Freeman et al. |
| 5,000,827 A | | 3/1991 | Schuster et al. |
| 5,061,144 A | * | 10/1991 | Akimoto et al. ..... 414/749.1 X |
| 5,135,636 A | | 8/1992 | Yee et al. |
| 5,138,973 A | | 8/1992 | Davis et al. |
| 5,156,174 A | | 10/1992 | Thompson et al. |
| 5,156,730 A | | 10/1992 | Bhatt et al. |
| 5,178,512 A | | 1/1993 | Skrobak |
| 5,217,586 A | | 6/1993 | Datta et al. |
| 5,222,310 A | | 6/1993 | Thompson et al. |
| 5,227,041 A | | 7/1993 | Brogden et al. |
| 5,256,274 A | | 10/1993 | Poris |
| 5,314,294 A | | 5/1994 | Taniguchi et al. |
| 5,344,491 A | | 9/1994 | Katou |
| 5,368,711 A | | 11/1994 | Poris |
| 5,376,176 A | | 12/1994 | Kuriyama |
| 5,377,708 A | | 1/1995 | Bergman et al. |
| 5,442,416 A | | 8/1995 | Tateyama et al. |
| 5,460,478 A | * | 10/1995 | Akimoto et al. ........ 414/941 X |
| 5,571,325 A | * | 11/1996 | Ueyama et al. ......... 414/217 X |
| 5,639,206 A | | 6/1997 | Oda et al. |
| 5,670,034 A | | 9/1997 | Lowery |
| 5,681,392 A | | 10/1997 | Swain |
| 5,684,713 A | | 11/1997 | Asada et al. |
| 5,700,127 A | * | 12/1997 | Harada et al. .............. 414/416 |
| 5,711,646 A | | 1/1998 | Ueda et al. |
| 5,723,028 A | | 3/1998 | Poris |
| 5,746,565 A | | 5/1998 | Tepolt |
| 5,754,842 A | | 5/1998 | Minagawa |
| 5,759,006 A | | 6/1998 | Miyamoto et al. |
| 5,765,444 A | * | 6/1998 | Bacchi et al. ........ 414/744.5 X |
| 5,765,889 A | | 6/1998 | Nam et al. |
| 5,785,826 A | | 7/1998 | Greenspan |
| 5,980,706 A | | 11/1999 | Bleck et al. |
| 5,985,126 A | | 11/1999 | Bleck et al. |
| 5,989,397 A | | 11/1999 | Laube et al. |
| 5,999,886 A | | 12/1999 | Martin et al. |
| 6,004,828 A | | 12/1999 | Hanson |
| 6,027,631 A | | 2/2000 | Broadbent |
| 6,028,986 A | | 2/2000 | Song |
| 6,074,544 A | | 6/2000 | Reid et al. |
| 6,090,260 A | | 7/2000 | Inoue et al. |
| 6,091,498 A | | 7/2000 | Hanson et al. |
| 6,110,346 A | | 8/2000 | Reid et al. |
| 6,151,532 A | | 11/2000 | Barone et al. |
| 6,156,167 A | | 12/2000 | Patton et al. |
| 6,159,354 A | | 12/2000 | Contolini et al. |
| 6,162,344 A | | 12/2000 | Reid et al. |
| 6,162,488 A | | 12/2000 | Gevelber et al. |
| 6,168,695 B1 | | 1/2001 | Woodruff et al. |
| 6,179,983 B1 | | 1/2001 | Reid et al. |
| 6,193,859 B1 | | 2/2001 | Contolini et al. |
| 6,199,301 B1 | | 3/2001 | Wallace |
| 6,228,232 B1 | | 5/2001 | Woodruff et al. |
| 6,234,738 B1 | * | 5/2001 | Kimata et al. .......... 414/941 X |
| 6,322,677 B1 | | 11/2001 | Woodruff et al. |
| 6,391,166 B1 | | 5/2002 | Wang |
| 6,481,956 B1 | | 11/2002 | Hofmeister |
| 2002/0008037 A1 | | 1/2002 | Wilson et al. |
| 2002/0125141 A1 | | 9/2002 | Wilson et al. |
| 2002/0139678 A1 | | 10/2002 | Wilson et al. |

FOREIGN PATENT DOCUMENTS

| | | |
|---|---|---|
| WO | WO 00/61837 | 10/2000 |
| WO | WO 01/90434 | 11/2001 |
| WO | WO 02/097165 | 12/2002 |
| WO | WO 02/099165 | 12/2002 |

OTHER PUBLICATIONS

U.S. patent application Ser. No. 60/129,055, McHugh, Apr. 13, 1999.

U.S. patent application Ser. No. 60/143,769, McHugh, filed Jul. 12, 1999.

U.S. patent application Ser. No. 60/182,160, McHugh et al., filed Feb. 14, 2000.

U.S. patent application Ser. No. 60/206,663, Wilson et al., filed May 24, 2000.

Lee, Tien–Yu Tom et al., "Application of a CFD Tool in Designing a Fountain Plating Cell for Uniform Bump Plating of Semiconductor Wafers," IEEE Transactions On Components, Packaging and Manufacturing Technology—Part B, Feb. 1996, pp 131–137, vol. 19, No. 1, IEEE.

Lowenheim, Frederick A., "Electroplating," Jan. 1979, 12 pgs, McGraw–Hill Book Company, USA.

Ritter, G., et al., "Two–And Three–Dimensional Numerical Modeling of Copper Electroplating for Advanced ULSI Metallization," Jun. 1999, 13 pgs, E–MRS Conference Symposium M. *Basic Models to Enhance Reliability*, Strasbourg, France.

PCT International Search Report for PCT/US02/17840, Applicant: Semitool, Inc., Mar. 2003, 5 pgs.

* cited by examiner

INTEGRATED TOOLS WITH TRANSFER DEVICES FOR HANDLING MICROELECTRONIC WORKPIECES

CROSS-REFERENCE TO RELATED APPLICATIONS

This application is a continuation-in-part of: (1) U.S. patent application Ser. No. 08/990,107, entitled "ROBOTS FOR MICROELECTRONIC WORKPIECE HANDLING," filed on Dec. 15, 1997 and now U.S. Pat. No. 6,672,820; (2) U.S. patent application Ser. No. 09/386,566, filed Aug. 31, 1999, entitled "IMPROVEDED ROBOT FOR MICROELECTRONIC WORKPIECE HANDLING," now U.S. Pat. No. 6,318,951, which is a continuation of International Patent Application No. PCT/US99/15567, filed Jul. 9, 1999, designating the U.S., entitled "ROBOTS FOR MICROELECTRONIC WORKPIECE HANDLING" which application claims priority from U.S. patent application Ser. No. 09/114,105, filed Jul. 11, 1998, entitled "ROBOT FOR MICROELECTRONIC WORKPIECE HANDLING" and now abandoned, (3) U.S. patent application Ser. No. 09/386,590, filed Aug. 31, 1999, entitled "ROBOTS FOR MICROELECTRONIC WORKPIECE HANDLING" and now U.S. Pat. No. 6,322,119, which is a continuation of International Patent Application No. PCT/US99/15567, filed Jul. 9, 1999, designating the U.S., entitled "ROBOTS FOR MICROELECTRONIC WORKPIECE HANDLING" which application claims priority from U.S. patent application Ser. No. 09/114,105, filed Jul. 11, 1998, entitled "ROBOT FOR MICROELECTRONIC WORKPIECE HANDLING;" and (4) U.S. application Ser. No. 09/618,707 filed Jul. 18, 2000, now U.S. Pat. No. 6,654,122 which is a divisional of U.S. application Ser. No. 08/680,056 filed Jul. 15, 1996 and now abandoned; all of which are herein incorporated by reference. Additionally, this application is related to the following:

(a) U.S. patent application Ser. No. 09/875,300, entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed Jun. 5, 2001;

(b) U.S. patent application Ser. No. 09/875,384, entitled "DISTRIBUTED POWER SUPPLIES FOR MICROELECTRONIC WORKPIECE PROCESSING TOOLS," filed Jun. 5, 2001;

(c) U.S. patent application Ser. No. 09/875,365, entitled "ADAPTABLE ELECTROCHEMICAL PROCESSING CHAMBER," filed Jun. 5, 2001;

(d) U.S. patent application Ser. No. 09/875,424, entitled "LIFT AND ROTATE ASSEMBLY FOR USE IN A WORKPIECE PROCESSING STATION AND A METHOD OF ATTACHING THE SAME," filed Jun. 5, 2001;

(e) U.S. patent application Ser. No. 09/872,151, entitled "APPARATUS AND METHODS FOR ELECTROCHEMICAL PROCESSING OF MICROELECTRONIC WORKPIECES," filed May 31, 2001;

(f) U.S. patent application Ser. No. 09/849,505, entitled "TUNING ELECTRODES USED IN A REACTOR FOR ELECTROCHEMICALLY PROCESSING A MICROELECTRONIC WORKPIECE," filed on May 24, 2001.

All of the foregoing Patent Applications identified by paragraphs (a)–(f) above are herein incorporated by reference.

TECHNICAL FIELD

The present invention relates to processing microelectronic workpieces and integrated tools with devices for handling such workpieces within an environment of the integrated tool.

BACKGROUND

Microelectronic devices, such as semiconductor devices and field emission displays, are generally fabricated on and/or in microelectronic workpieces using several different types of machines ("tools"). Many such processing machines have a single processing station that performs one or more procedures on the workpieces. Other processing apparatus have a plurality of processing stations that perform a series of different procedures on individual workpieces or batches of workpieces. The workpieces are generally handled within the processing apparatus by automatic handling equipment (i.e., robots) because microelectronic fabrication requires extremely clean environments, very precise positioning of the workpieces, and conditions that are not suitable for human access (e.g., vacuum environments, high temperatures, chemicals, etc.).

An increasingly important category of processing apparatus are plating tools that plate metals and other materials onto workpieces. Existing plating tools use automatic handling equipment to handle the workpieces because the position, movement and cleanliness of the workpieces are important parameters for accurately plating materials onto the workpieces. The plating tools can be used to plate metals and other materials (e.g., ceramics or polymers) in the formation of contacts, interconnects and other components of microelectronic devices. For example, copper plating tools are used to form copper contacts and interconnects on semiconductor wafers, field emission displays, read/write heads, and other types of microelectronic workpieces. A typical copper plating process involves depositing a copper seed layer onto the surface of the workpiece using chemical vapor deposition (CVD), physical vapor deposition (PVD), electroless plating processes, or other suitable methods. After forming the seed layer, copper is plated onto the workpiece by applying an appropriate electrical field between the seed layer and an anode in the presence of an electrochemical plating solution. The workpiece is then cleaned, etched and/or annealed in subsequent procedures before transferring the workpiece to another apparatus.

Single-wafer plating tools generally have a load/unload station, a number of plating chambers, a number of cleaning chambers, and a transfer mechanism for moving the microelectronic workpieces between the various chambers and the load/unload station. The transfer mechanism can be a rotary system having one or more robots that rotate about a fixed location in the plating tool. One existing rotary transfer mechanism is shown in U.S. Pat. No. 6,136,163 issued to Cheung, et al., which is herein incorporated by reference in its entirety. Alternate transfer mechanisms include linear systems that have an elongated track and a plurality of individual robots that can move independently along the track. Each of the robots on a linear track can also include independently operable end-effectors. Existing linear track systems are shown in U.S. Pat. No. 5,571,325 issued to Ueyama, et al., PCT Publication No. WO 00/02808, and U.S. patent application Ser. Nos. 09/386,566; 09/386,590; 09/386,568; and 09/759,998, all of which are herein incorporated in their entirety by reference. Many rotary and linear transfer mechanisms have a plurality of individual robots that can each independently access most, if not all, of the processing stations within an individual tool to increase the flexibility and throughput of the plating tool.

The processing tools used in fabricating microelectronic devices must meet many performance criteria. For example, many processes must be able to form components that are much smaller than 0.5 μm, and even on the order of 0.1 μm. The throughput of these processing tools should also be as high as possible because they are typically expensive to purchase, operate and maintain. Moreover, microelectronic processing tools typically operate in clean rooms that are expensive to construct and maintain. The throughput, and thus the value of most processing tools, is evaluated by the number of wafers per hour per square foot (w/hr/ft²) that the processing tool can produce with adequate quality. Therefore, plating tools and many other processing tools require fast, accurate transfer mechanisms and an efficient layout of processing chambers to accomplish acceptable throughputs.

One concern of existing processing apparatus is that the wafers may collide with one another as the transfer mechanism handles the wafers within a tool. Because many processing apparatus have a plurality of individual robots that move independently from each other to access many processing chambers within a single apparatus, the motion of the individual robots must be orchestrated so that the workpieces do not collide with each other or components of the tool. This typically requires complex algorithms in the software for controlling the motion of the workpieces, such as "rules" that inhibit robot movements that would result in collisions. The complexity of the software often necessitates significant processor capabilities and processing time, which would accordingly increase the cost of the processing tools and affect the throughput of workpieces. Additionally, errors in determining the position of the workpieces, executing the software, or calibrating the system can result in collisions between workpieces. Thus, it would be desirable to avoid collisions with workpieces in a manner that does not adversely impact other parameters of the processing apparatus.

The layout and the capabilities of the processing stations in a processing apparatus also influence the throughput of processed workpieces. The area within the tool for housing the processing stations and the transfer mechanism is typically quite limited because it is desirable to reduce the floor space occupied by the tool. The layout of the processing stations is not only a function of the throughput of the processing tool, but it can also be a function of handling clean and dirty wafers within the integrated tool relative to the processing stations and the load/unload station. The throughput of finished wafers is also a function of the time that it takes for the transfer mechanism to transfer the workpieces between the loading station and/or the processing stations. Therefore, the layout and configuration of the load/unload station and the processing stations relative to the operation of the transfer mechanism is a factor in developing integrated tools.

SUMMARY

The present invention is directed toward transfer devices for handling microelectronic workpieces and integrated tools for processing microelectronic workpieces. Several embodiments of integrated tools comprise a single robot, dual end-effector transfer device that is expected to increase the flexibility of designing integrated tools. By using a single robot, less space is needed within the cabinet for the robot. As a result, more space can be used for the processing chambers so that larger processing chambers can be used in the same or very similar foot print as smaller chambers. This is useful as many device fabricators transition from using 200 mm wafers to 300 mm wafer because 300 mm tools can be used in approximately the same area as 200 mm tools, and the 300 mm tools can have the same number of processing chambers as the 200 mm tools. Thus, several embodiments of single robots with dual end-effectors in accordance with the invention allow designers to more easily replace 200 mm tools with 300 mm tools.

Another feature is that each of the end-effectors of the single robot can service processing chambers in either row inside tool. The integrated tools can accordingly have several different configurations of processing chambers that can be assembled on a "custom basis." The processing chambers can have a common configuration so that different types of processing chambers can be mounted to the tool within the cabinet. By providing a robot with two end-effectors that have a significant range of motion, each end-effector can access any of the processing chambers so that the configuration of the processing chambers in the tool is not limited by the motion of the robot and/or the end-effectors. Therefore, the processing chambers can be arranged in a configuration that affords an efficient movement of workpieces through the tool to enhance the throughput.

The throughput of finished workpieces is also expected to be enhanced because the workpieces cannot collide with each other or another robot in the tool when a single robot with dual end-effectors is used. The robot can accordingly be a high-speed device that moves quickly to reduce the time that each workpiece rests on an end-effector. Additionally, the robot can move quickly because it does not need complex collision-avoidance software that takes time to process and is subject to errors. The single robot can accordingly service the processing stations as quickly as a dual robot system with single end-effectors on each robot. In several embodiments of the invention, therefore, the combination of having a fast, versatile robot and a flexible, efficient arrangement of processing stations provides a high throughput (w/hr/ft²) of finished workpieces.

In an aspect of one embodiment, an integrated tool can comprise a cabinet defining an interior enclosure, a first set of processing stations, and a second set of processing stations. The first set of processing stations can be arranged in a first row on one side of the enclosure, and the second set of processing stations can be arranged on an opposing side of the enclosure. For example, the first set of processing stations can include a first cleaning chamber and/or a first electroplating chamber, and the second set of processing stations can include a second cleaning chamber and/or a second electroplating chamber. In an alternate aspect, the processing stations can include an annealing station. The integrated tool can also include a track in the enclosure. The track, for example, can extend between the first and second rows of processing stations.

The integrated tool also includes a robot unit in the enclosure that has a transport unit and an arm assembly carried by the transport unit. The transport can be carried by the track to move along the track for positioning the arm assembly proximate to a desired processing station. The arm assembly includes an arm operatively coupled to the transport unit to move along a lift path and to rotate about the lift path. The lift path is transverse to the track. A first end-effector and a second end-effector are carried by the arm. The first and second end-effectors can rotate about at least one rotation axis that is at least generally parallel to the lift path. In one embodiment, the first end-effector rotates about a first rotation axis and the second end-effector rotates about a second rotation axis. The first end-effector can also rotate through a first plane and the second end-effector can rotate through a second plane spaced apart from the first plane.

The arm can include a medial section coupled to a waist member, a first extension projecting from one side of the medial section, and a second extension projecting from another side of the medial section. The first and second extensions can be integral with one another or they can be separate sections that are fixedly attached to each other. As a result, the robot unit can include a single arm with two extensions such that rotation of the arm causes both of the extensions to rotate about a single axis. In still another embodiment, the first end-effector is spaced above the arm by a first distance, and the second end-effector is spaced above the arm by a second distance. The first distance is different than the second distance to space the first end-effector at a different elevation than the second end-effector. The different spacing of the first and second end-effectors relative to the arm allows the device to carry two workpieces in a superimposed relationship without the potential of a collision between the workpieces. Several additional embodiments and alternate embodiments of devices, systems and methods are also included in the invention.

DETAILED DESCRIPTION

The following description discloses the details and features of several embodiments of transfer devices for handling microelectronic workpieces and integrated tools for processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the art to make and use the disclosed embodiments. Several of the details and advantages described below, however, may not be necessary to practice certain embodiments of the invention. Additionally, the invention can also include additional embodiments that are within the scope of the claims, but are not described in detail with respect to FIGS. 1–5.

Figure 1:
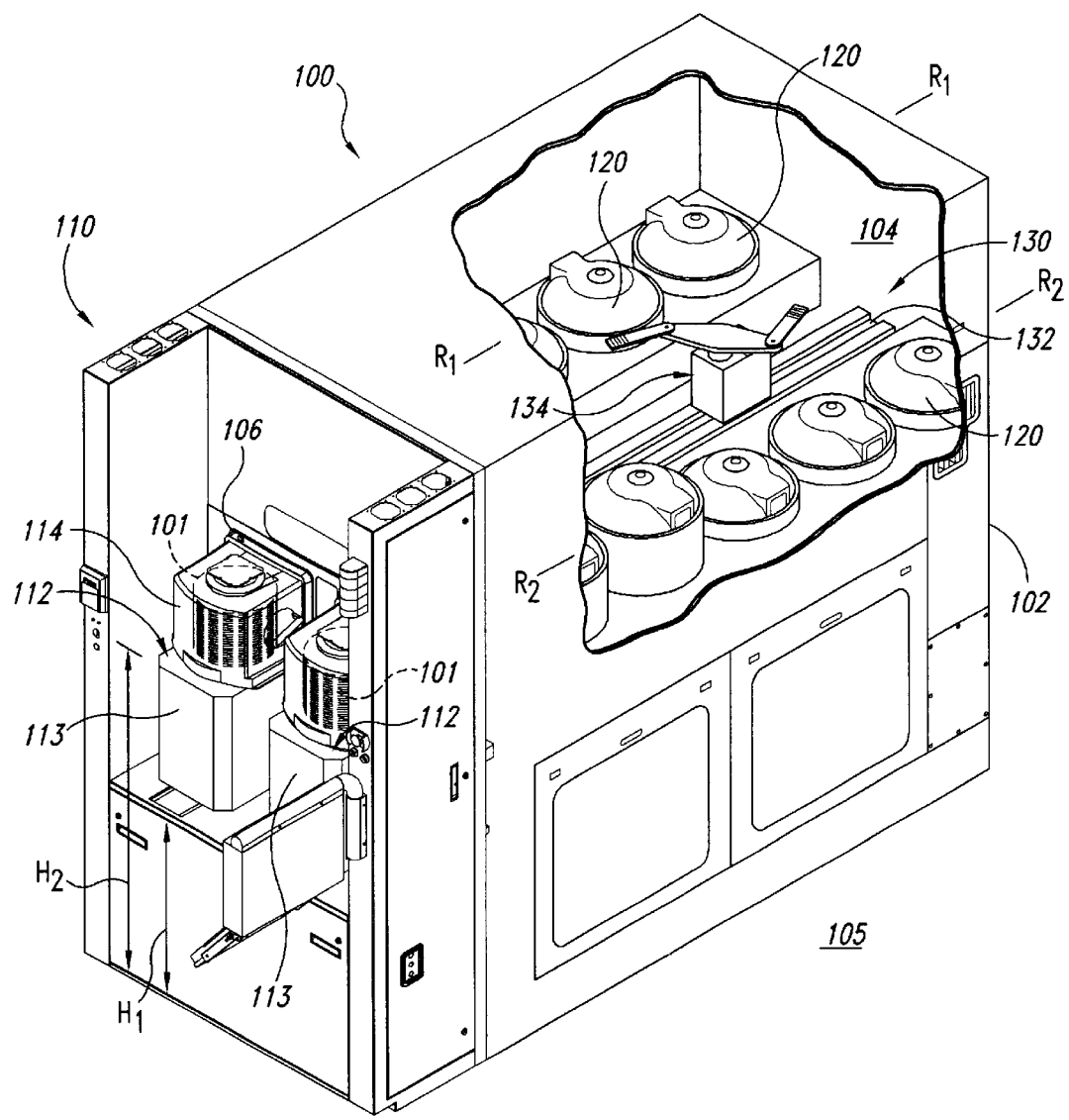
FIG. 1 is an isometric view of a processing apparatus for processing microelectronic workpieces including a transfer device for handling the workpieces in accordance with an embodiment of the invention. A portion of the processing apparatus is shown in a cut-away illustration.

A. Selected Embodiments of Integrated Tools with Automatic Workpiece Transfer Devices FIG. 1 is an isometric view of a processing apparatus 100 having a workpiece-handling device 130 in accordance with an embodiment of the invention for manipulating a plurality of microelectronic workpieces 101. A portion of the processing apparatus 100 is shown in a cut-away view to illustrate selected internal components. In one aspect of this embodiment, the processing apparatus 100 can include a cabinet 102 having an interior region 104 defining an interior enclosure that is at least partially isolated from an exterior region 105. The cabinet 102 can also include a plurality of apertures 106 through which the workpieces 101 can ingress and egress between the interior region 104 and a load/unload station 110.

The load/unload station 110 can have two container supports 112 that are each housed in a protective shroud 113. The container supports 112 are configured to position workpiece containers 114 relative to the apertures 106 in the cabinet 102. The workpiece containers 114 can each house a plurality of microelectronic workpieces 101 in a "mini" clean environment for carrying a plurality of workpieces through other environments that are not at clean room standards. Each of the workpiece containers 114 is accessible from the interior region 104 of the cabinet 102 through the apertures 106.

The processing apparatus 100 can also include a plurality of processing stations 120 and a transfer device 130 in the interior region 104 of the cabinet 102. The processing apparatus, for example, can be a plating tool, and the processing stations 120 can be single-wafer chambers for electroplating, electroless plating, annealing, cleaning, etching, and/or metrology analysis. Suitable processing stations 120 for use in the processing apparatus 100 are disclosed in U.S. Pat. Nos. 6,228,232 and 6,080,691, and in U.S. application Ser. Nos. 09/385,784; 09/386,803; 09/386,610; 09/386,197; 09/501,002; 09/733,608; 09/804,696; and 09/804,697, all of which are herein incorporated in their entirety by reference. The processing stations 120 are not limited to plating devices, and thus the processing apparatus 100 can be another type of tool.

The transfer device 130 moves the microelectronic workpieces 101 between the workpiece containers 114 and the processing stations 120. The transfer device 130 includes a linear track 132 extending in a lengthwise direction of the interior region 104 between the processing stations 120. In the particular embodiment shown in FIG. 1, a first set of processing stations 120 is arranged along a first row $R_1$—$R_1$ and a second set of processing stations 120 is arranged along a second row $R_2$—$R_2$. The linear track 130 extends between the first and second rows of processing stations 120. The transfer device 130 can further include a robot unit 134 carried by the track 132. As explained in more detail below, the combination of the linear transfer device 130 and the arrangement of the processing stations 120 provides a good throughput rate of microelectronic workpieces and inhibits collisions with workpieces that are carried by the robot unit 134.

Figure 2:
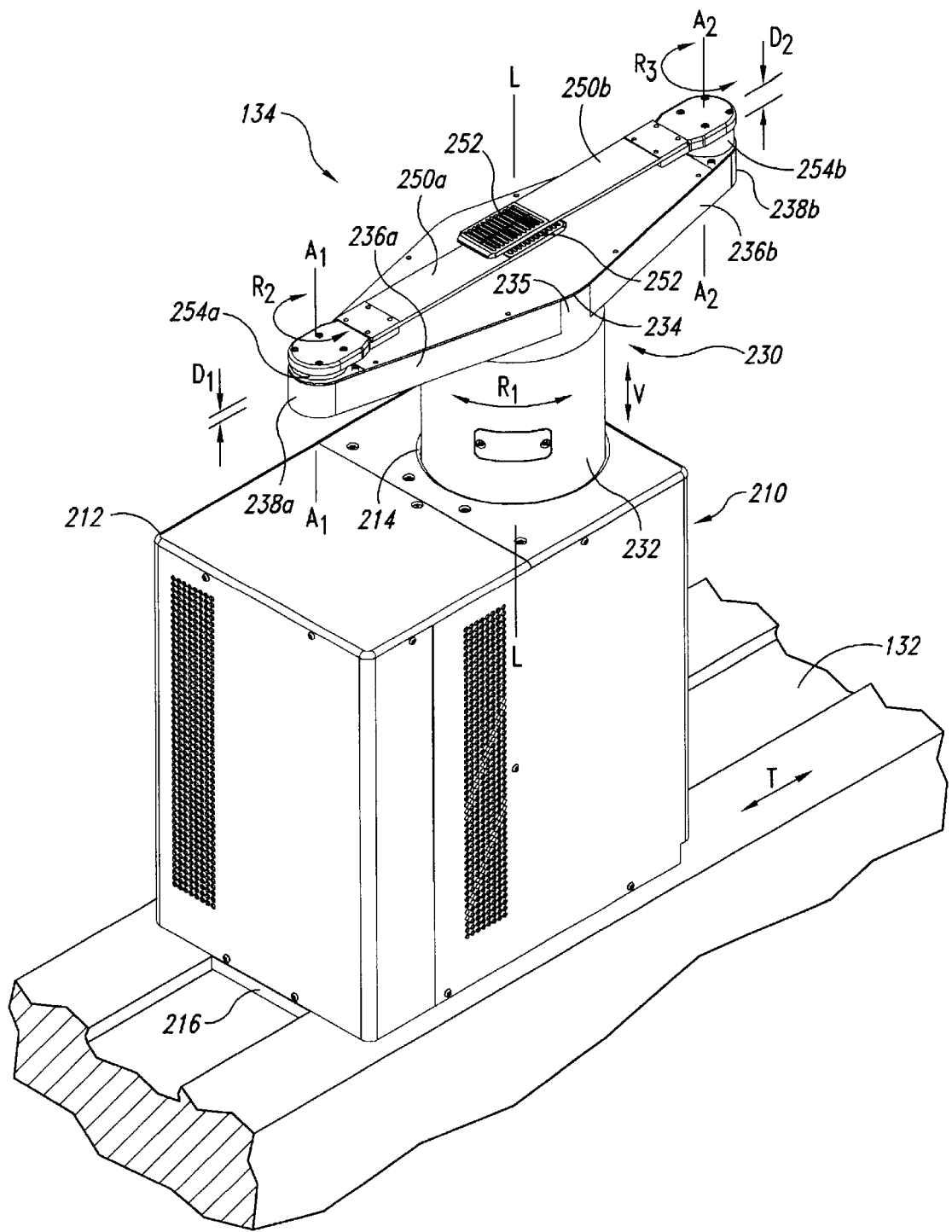
FIG. 2 is an isometric view of a transfer device for handling microelectronic workpieces in accordance with an embodiment of the invention.

B. Embodiments of Transfer Devices for Handling Microelectronic Workpieces in Integrated Tools FIG. 2 illustrates an embodiment of the robot unit 134 in greater detail. The robot unit 134 can include a transport unit 210, an arm assembly 230 carried by the transport unit 210, and first and second end-effectors 250 (identified individually by reference numbers 250a and 250b) carried by the arm assembly 230. The transport unit 210 can include a shroud or housing 212 having a plurality of panels attached to an internal frame (not shown in FIG. 2). An opening 214 in a top panel of the housing 212 receives a portion of the arm assembly 230. It will be appreciated that the transport unit 210 and the housing 212 can have many different configurations depending upon the particular environment in which the robot unit 134 is used. The transport unit 210, for example, can be a base that can be stationary, rotary, or move in a non-linear manner. The transport unit 210 can also include a guide member configured to move laterally along the track 132. The particular embodiment of the transport unit 210 shown in FIG. 2 includes a guide member defined by a base plate 216 that slidably couples the robot unit 134 to the track 132. The robot unit 134 can accordingly translate along the track 132 (arrow T) to position the robot unit 134 adjacent to a desired processing station 120 (FIG. 1).

The arm assembly 230 can include a waist member 232 that is coupled to a lift assembly (not shown in FIG. 2). The arm assembly 230 can also include an arm 234 having a medial section 235, a first extension 236a projecting from one side of the medial section 235, and a second extension 236b extending from another side of the medial section 235. The first and second extensions 236a–b of the arm 234 can be diametrically opposed to one another as shown in FIG. 2, or they can extend at a desired angle to each other. In one embodiment, the first and second extensions 236a and 236b are integral with another, but in alternate embodiments the first and second extensions 236a and 236b can be individual components that are fixed to each other.

The arm assembly 230 can move along a lift path L—L to change the elevation of the arm 234 for positioning the end-effectors 250 at desired elevations. The lift path L—L generally extends transverse to the track 132, which as used herein includes any oblique or perpendicular arrangement. The arm assembly 230 can also rotate (arrow $R_1$) about the lift path L—L to position a distal end 238a of the first extension 236a and/or a distal end 238b of the second extension 236b proximate to a desired workpiece container 114 or processing station 120. The first and second extensions 236a–b generally rotate about the lift path L—L as a single unit because they are integral or fixed with each other. The motions of the first and second extensions 236a and 236b are accordingly dependent upon each other in this embodiment. In alternate embodiments, the arm 234 can have extensions that are not fixed to each other and can move independently from each other.

The end-effectors 250 are rotatably carried by the arm 234. In one embodiment, the first end-effector 250a is rotatably coupled to the first distal end 238a to rotate about a first rotation axis $A_1$—$A_1$ (arrow $R_2$). The second end-effector 250b can be rotatably coupled to the second distal end 238b of the arm 234 to rotate about a second rotation axis $A_2$—$A_2$ (arrow $R_3$). The first and second rotation axes $A_1$—$A_1$ and $A_2$—$A_2$ can extend generally parallel to the lift path L—L, but in alternate embodiments these axes can extend transverse to the lift path L—L. The end-effectors 250a–b can each include a workpiece holder 252 for holding the workpieces 101 to the end-effectors 250. The workpiece holders 252 shown in FIG. 2 are vacuum chucks that hold the workpieces 101 to the end-effectors 250 using suction. Alternate embodiments of workpiece holders 252 can include edge-grip end-effectors, such as those disclosed in the foregoing patent applications that have been incorporated by reference. As explained in more detail below with reference to FIGS. 3A–3C, the rotational motion of (a) the arm 234 about the lift path L—L, (b) the first end-effector 250a about the first rotation axis $A_1$—$A_1$, and (c) the second end-effector 250b about the second rotation axis $A_2$—$A_2$ can be coordinated so that the first and second end-effectors 250a and 250b can each be positioned adjacent to any of the workpiece containers 114 and processing stations 120 on either side of the cabinet 102 (FIG. 1).

The first end-effector 250a can be spaced apart from the arm 234 by a first distance $D_1$, and the second end-effector 250b can be spaced apart from the arm 234 by a second distance $D_2$. In the embodiment shown in FIG. 2, the distance $D_1$ is less than the distance $D_2$ such that the first end-effector 250a is at a different elevation than the second end-effector 250b. The first end-effector 250a accordingly moves through a first plane as it rotates about the first rotation axis $A_1$—$A_1$, and the second end-effector 250b moves through a second plane as it rotates about the second rotation axis $A_2$—$A_2$. The first and second planes are generally parallel and fixedly spaced apart from each other so that the end-effectors 250a–b cannot interfere with each other. The first and second planes, however, can have other arrangements (i.e., nonparallel) so long as they do not intersect in a region over the arm 234. The first and second end-effectors 250a and 250b can be fixed at the particular elevations relative to the arm 234 using spacers or other types of devices. For example, the first end-effector 250a can be spaced apart from the arm 234 by a first spacer 254a, and the second end-effector 250b can be spaced apart from the arm 234 by a second spacer 254b. The first and second spacers 254a–b can have different thicknesses to space the end-effectors 250 apart from the arm 234 by the desired distances.

The first and second end-effectors 250a–b and the arm 234 can have different configurations than the configuration shown in FIG. 2. For example, the arm can have only a single extension projecting from the waist member 232 and both of the end-effectors can be carried by the "single-extension" arm such that the first and second end-effectors are fixed at different elevations relative to the arm. The end-effectors, for example, can be coupled to a common area of the arm and rotate about a common rotation axis, but at different elevations.

C. Additional Embodiments of Integrated Tools with Transfer Devices

Figure 3A:
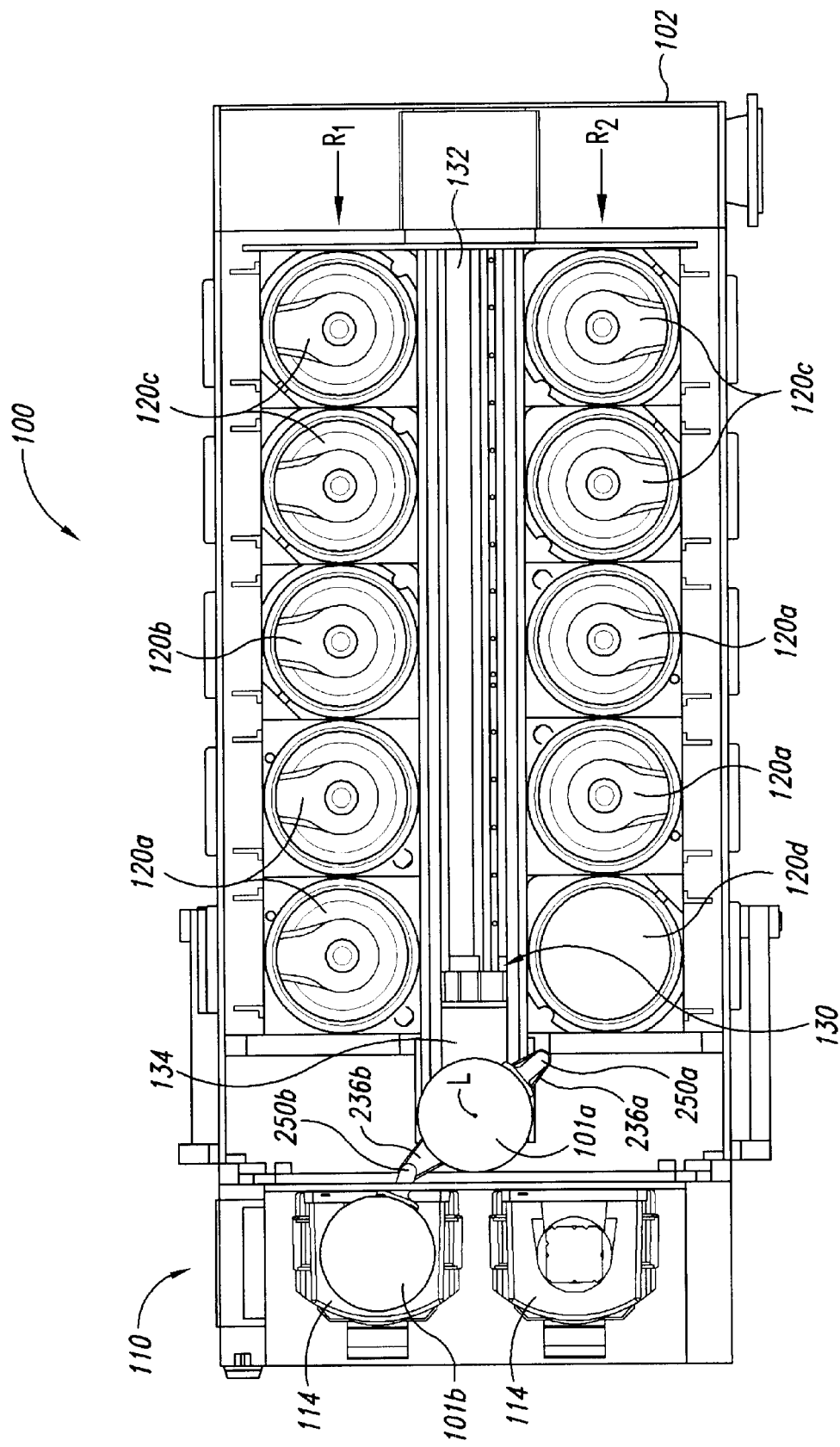
FIG. 3A is a top plan view of a processing apparatus for processing microelectronic workpieces showing one configuration for operating a transfer device in accordance with an embodiment of the invention.
Figure 3B:
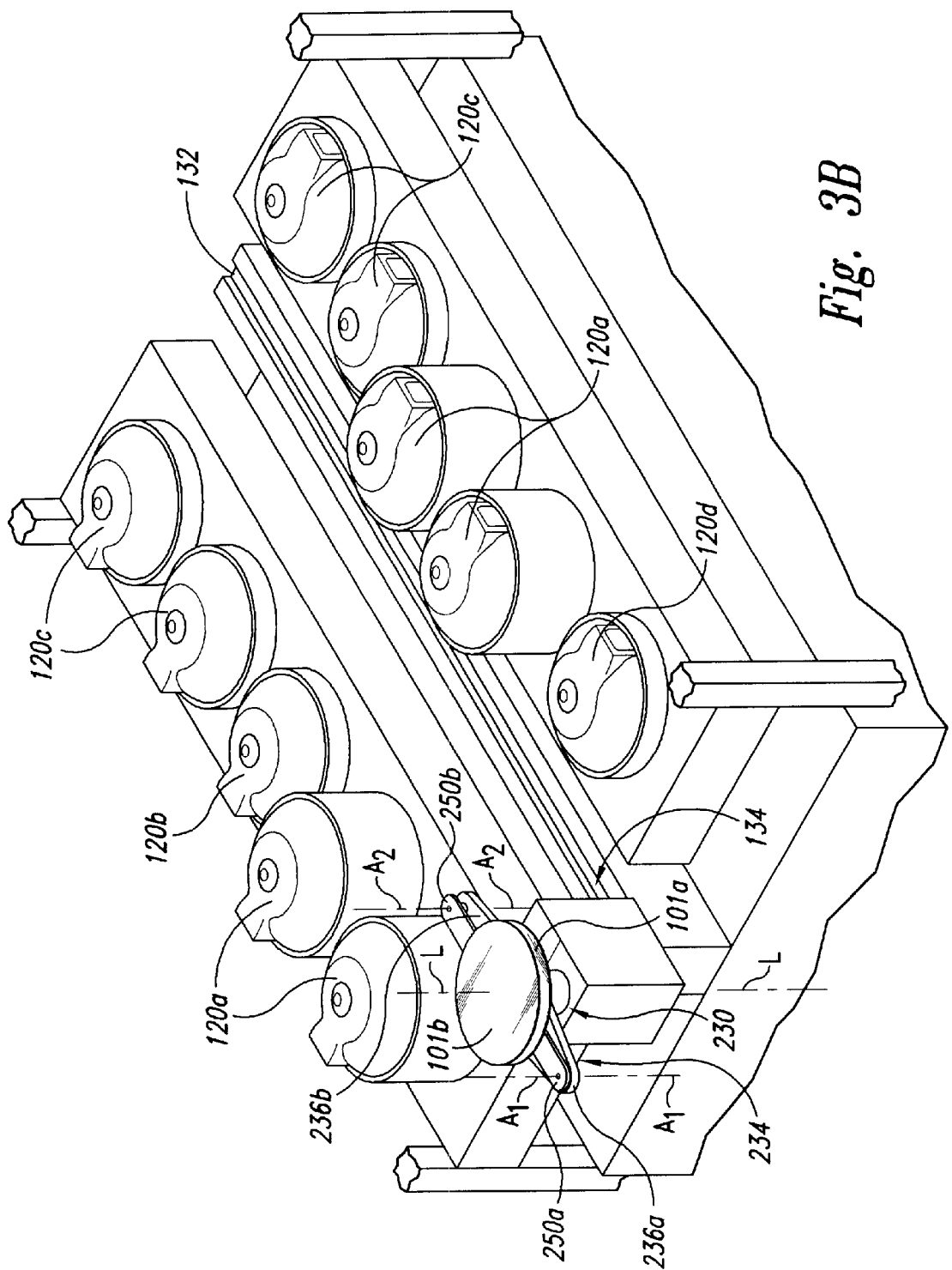
FIG. 3B is a partial isometric view of the transfer device of FIG. 3A showing another configuration for operating the transfer device.
Figure 3C:
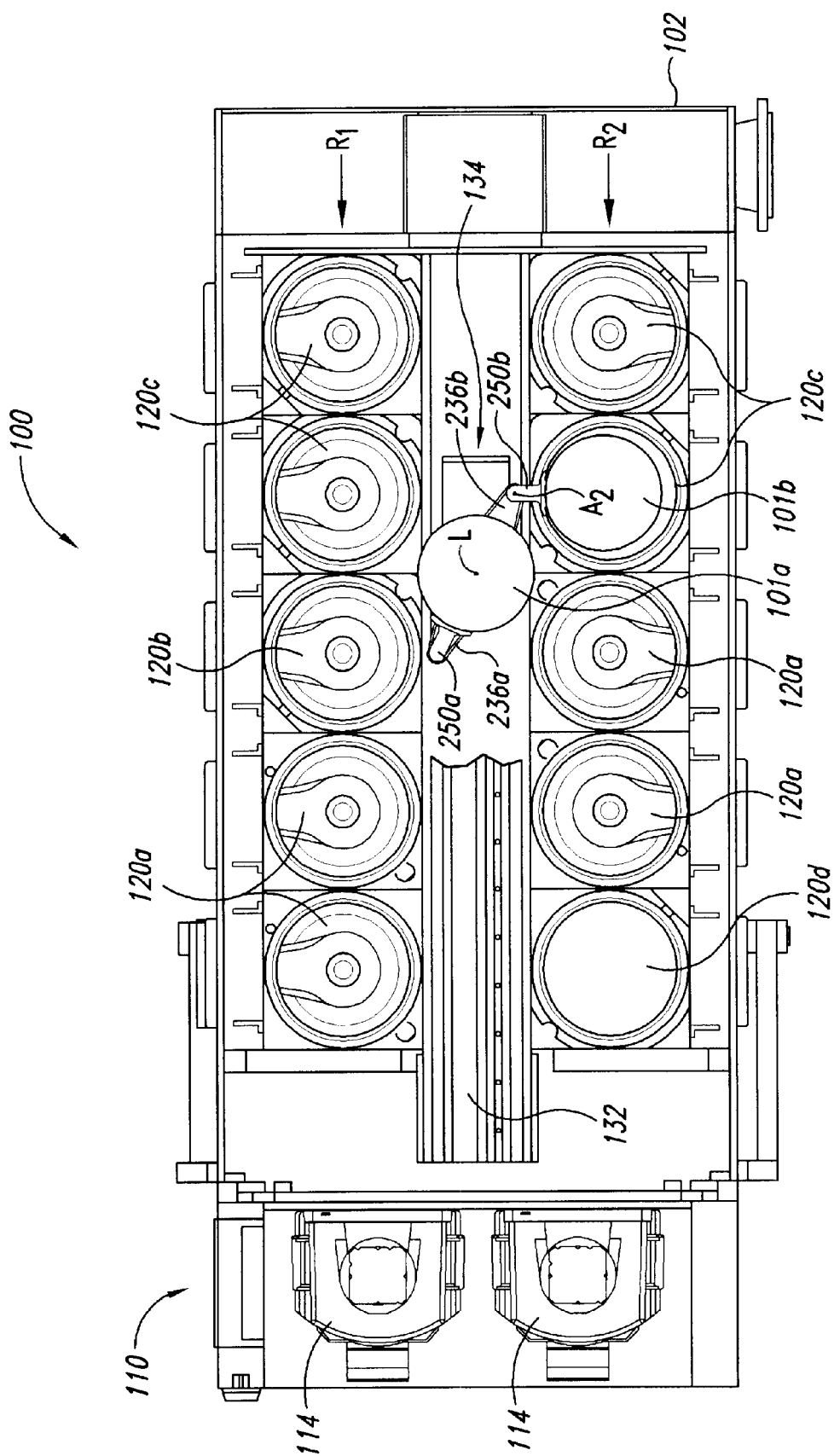
FIG. 3C is a top plan view of the transfer device of FIGS. 3A and 3B showing another configuration for operating the transfer device.

FIGS. 3A–3C illustrate an arrangement of processing stations 120 and several configurations of operating the transfer device 130 in greater detail. The processing stations 120 can include any combination of (a) cleaning chambers 120a; (b) electroless plating chambers 120b; (c) electroplating chambers 120c; (d) Rapid Thermal Annealing (RTA) chambers 120d; (e) metrology stations (not shown in FIG. 3A) and/or other types of modular single-wafer processing stations. In the particular embodiment shown in FIG. 3A, the first row $R_1$ of processing stations 120 includes a plurality of cleaning chambers 120a proximate to the load/unload station 110, an electroless plating chamber 120b downstream from the cleaning chambers 120a, and a plurality of electroplating chambers 120c downstream from the electroless plating chamber 120b. The second row $R_2$ of processing stations of this particular embodiment has a similar arrangement, except that an RTA chamber 120d is at the output side of the load/unload station 110 and there is not an electroless chamber between the cleaning chamber 120a and the electroplating chambers 120c. The cleaning chambers 120a can be rinse chambers, spin-rinse-dry chambers, etch chambers, etch/rinse chambers, or other types of chambers. The cleaning chambers 120a, for example, can each be a single wafer wet cleaning CAPSULE™ capable of single or dual side selectable processing of a workpiece with bevel and edge processing capabilities in the Millenium® tool manufactured by Semitool Inc. and described in U.S. patent application Ser. No. 09/041,901 filed on Mar. 13, 1998; Ser. No. 09/113,435 filed on Jul. 10, 1998; and Ser. No. 09/437,926 filed on Nov. 11, 1999; all of which are herein incorporated by reference. The CAPSULE™ cleaning chambers are well-suited for removing metal from the backside of the workpiece, performing an etching process for creating a bevel and/or a well-defined edge exclusion area, rinsing the workpiece, and drying the workpiece.

The arrangement of processing stations illustrated in FIG. 3A represents only one example of how the processing stations 120 can be arranged within the cabinet 102. In alternate embodiments a metrology station can be substituted for one or more of the other processing stations, the position of the processing stations relative to the load/unload station 110 can be changed, and/or other types of processing stations can be used such that some of the processing stations illustrated in FIG. 3A may not be included in the processing apparatus 100. For example, the position of the cleaning chambers 120a and the electroplating chambers 120c can be switched, or additional electroplating chambers 120c can be substituted for the electroless chamber 120b and the RTA chamber 120d.

FIG. 3A illustrates one configuration of operating the transfer device 130 after a first workpiece 101a has been loaded onto the first end-effector 250a. The operation of the first end-effector 250a can be similar to that of the second end-effector 250b, and thus only the movement of the second end-effector 250b will be described below for purposes of brevity. The robot unit 134 can move the arm assembly 230 (FIG. 2) so that the second end-effector 250b can pick up a second workpiece 101b from a workpiece container 114 (the "in-WIP"). To do this the robot unit 134 positions the first workpiece 101a in a transport position over the lift path L—L, and then the arm assembly 230 (FIG. 2) moves vertically until the second end-effector 250b is at a desired height to pass underneath the second workpiece 101b. The arm assembly 230 then rotates the second extension 236b about the lift path L—L (FIG. 2) and/or the second end-effector 250b rotates about the second rotation axis $A_2$—$A_2$ (FIG. 2) until the second end-effector 250b is under the second workpiece 101b. The arm assembly 230 can then be raised as a vacuum is drawn through the workpiece holder 252 (FIG. 2) to securely hold the second workpiece 101b to the second end-effector 250b. The robot unit 134 then extracts the second workpiece 101b from the workpiece container 114 by a combination of movements of the robot unit 134 along the track 132, rotation of the second extension 236b about the lift path L—L, and/or rotation of the second end-effector 250b about the second rotation axis $A_2$—$A_2$. The remaining workpieces in the container 114 can be loaded onto the end-effectors 250 in subsequent processing in a similar manner by further adjusting the height of either the workpiece container 114 and/or the arm assembly 230 (FIG. 2), or they can be unloaded into the other container 114 by reversing this procedure. In general, it is more desirable to move the arm assembly to the correct height than it is to move the workpiece containers 114 because this eliminates the need to precisely index all of the workpieces. After picking up the workpieces 101, the transfer device 130 can load or unload any of the workpieces 101 carried by the robot unit 134 in any of the processing stations 120 in either the first row $R_1$ or the second row $R_2$.

The flow of the workpieces through the processing stations 120 varies according to the particular application and use of the processing apparatus 100. In one embodiment, the transfer device 130 can restrict one of the end-effectors to handle only clean workpieces and the other end-effector to handle only dirty workpieces. The clean end-effector can be used to handle the workpieces in the workpiece containers and to remove the workpieces from the cleaning chamber 120a. The dirty end-effector can be used to remove workpieces from the plating chambers 120b and 120c and then input the dirty workpieces into the cleaning chambers 120a.

One particular process flow for plating copper or other materials onto the second workpiece 101b involves placing the second workpiece 101b in either (a) the electroless plating chamber 120b if the seed layer needs to be enhanced or (b) one of the electroplating chambers 120c. After the workpiece 101b has been plated, the transfer device 130 extracts the workpiece 101b from the corresponding electroplating chamber 120c and typically places it in a cleaning chamber 120a. The second workpiece 101b can then be withdrawn from the cleaning chamber 120a and placed in the other workpiece container 114 for finished workpieces (the "out-WIP"). It will be appreciated that this process flow is merely one example of potential process flows, and that the movement of the workpieces through the processing stations 120 varies according to the particular configuration of the processing apparatus and the processes being performed on the workpieces. For example, the workpiece 101b can be transferred to the annealing chamber 120d after the cleaning chamber 120a before it is placed in the out-WIP. Alternatively, the process can include a number of plating procedures with various pre-wets and cleans, such as a copper plating cycle and lead solder plating cycle, or a nickel plating cycle and gold plating cycle.

FIG. 3B illustrates another configuration of operating the transfer device 130 in which the workpieces 101a–b are positioned for being moved along the track 130. The second workpiece 101b is superimposed over the first workpiece 101a by rotating the first end-effector 250a about the first rotation axis $A_1$—$A_1$ and rotating the second end-effector 250b about the second rotation axis $A_2$—$A_2$ until both end-effectors are over the arm. The arm 234 also rotates about the lift path L—L so that the arm 234 and the first and second extensions 236a and 236b extend generally in the direction of the track 132. The robot unit 134 can then translate along the track 132 between the processing stations 120.

The configuration illustrated in FIG. 3B is particularly useful in 300 mm applications to reduce the overall width of the processing apparatus 100. It is desirable to minimize the area of the floor space occupied by each processing apparatus, but many designs for accommodating 300 mm wafers tend to occupy much larger areas than those for use with 200 mm wafers because the processing stations and the area between the processing stations must be able to accommodate the larger wafers. By superimposing the workpieces over one another for transport along the track 132, the open area used for transporting the workpieces between the rows of processing stations can be reduced to approximately the diameter of a single workpiece. Additionally, the same configuration can be used for handling 200 mm wafers such that the area of floor space occupied by a 300 mm tool is not significantly more, if any, than a 200 mm tool. After the workpieces 101a–b are superimposed for movement along the track 132, the robot unit 134 can move along the track to a desired processing station and the arm assembly 230 can move vertically along the lift path L—L to position the workpieces at desired elevations.

FIG. 3C illustrates another configuration of operating the transfer device 130 in which the robot unit 134 is loading the second workpiece 101*b* into one of the electroplating chambers 120*c*. The robot unit 134 slides along the track 132 until the second extension 236*b* of the arm 234 (FIG. 3B) is proximate to the desired electroplating station 120*c*. The arm 234 then rotates about the lift path L—L and the second end-effector 250*b* rotates about the second rotation axis $A_2$—$A_2$ until the second workpiece 101*b* is positioned over an inverted head of the electroplating station 120*c*. The robot unit 134 can accordingly position each of the end-effectors 250*a* and 250*b* on the desired side of the cabinet 102 and at a desired height so that the end-effectors 250*a* and 250*b* can each access any of the processing stations 120 in either the first row $R_1$ or the second row $R_2$. The transfer device 130 accordingly provides a single-robot having a single arm and dual end-effectors that can service any of the workpiece containers 114 and/or processing modules 120 within the cabinet 102.

Several embodiments of the transfer device 130 are expected to prevent collisions with the workpieces 101 without complex software algorithms or complex mechanical systems. An aspect of these embodiments of the transfer device 130 is that they have only a single arm and the end-effectors are coupled to the single arm so that the first end-effector operates in a first plane and the second end-effector operates in a second plane that does not intersect the first plane over the arm. The first and second end-effectors can be mechanically spaced apart from each other to operate in different planes by rotatable spacers that space the first and second end-effectors apart from the arm by first and second distances, respectively, irrespective of the elevation of the arm itself. The end-effectors are thus arranged so that they can rotate freely relative to the arm but the workpieces cannot collide with each other. Therefore, the embodiments of the transfer device 130 that have a single arm with dual end-effectors coupled to the arm at different elevations are expected to mitigate collisions between the workpieces.

Several embodiments of the transfer device 130 are also versatile and can be used in many different tools because the end-effectors have a significant freedom of movement. An aspect of an embodiment of the transfer device 130 is that the arm can (a) translate along a track through the machine, (b) move transversely to the track along a lift path to change the elevation of the end-effectors, and (c) rotate about the lift-path. This allows the arm to position the end-effectors at a number of locations and elevations within the tool so that the tool can have several different types and arrangements of processing stations serviced by a single robot. Another aspect is that the end-effectors can be located at opposite ends of the arm, and they can independently rotate about the arm. This allows each end-effector to service any of the processing stations within the tool. Thus, several embodiments of the transfer device 130 provide the benefits of having two independently operable end-effectors in a single robot unit without the complex mechanical components and software required for systems with two separate robot units.

Many of the embodiments of the transfer device 130 also provide a high throughput of finished wafers. The throughput of a machine used to fabricate microelectronic devices is typically measured by the w/hr/ft² processed through the machine. One aspect of providing a high throughput is that the linear track allows several processing stations to be arranged in rows which are serviced by a single robot. The linear arrangement of processing stations and the linear-track transfer device significantly decrease the floor space required for each processing station compared to systems that use a rotary robot system. Moreover, by transferring the workpieces along the track in a superimposed arrangement, the distance between the rows of processing stations can be reduced to approximately a single wafer diameter. This is particularly useful in 300 mm applications because carrying these workpieces side-by-side along a track would require a significant increase in the foot print of the processing tool. Another aspect of providing a high throughput is that the single-arm, dual end-effector robot can operate quickly to access all, or at least most, of the processing stations in the tool because (a) it does not need to have complex collision avoidance algorithms that slow down processing time, and (b) it can use high-speed motors for a high operating speed. The combination of maintaining a fast, versatile robot unit and an arrangement that provides an efficient foot print accordingly provides a high throughput (w/hr/ft²) for several embodiments of the processing apparatus 100.

In addition to the configurations of processing stations 120 disclosed above, the electroplating chambers 120*c* can have different types of contact assemblies for performing different types of electroplating procedures. Referring to FIG. 3C, for example, the electroplating chambers 120*c* in row $R_1$ can have wet-contact assemblies and the electroplating chambers 120*c* in row $R_2$ can have dry-contact assemblies. Suitable types of wet- and dry-contact assemblies are disclosed in U.S. application Ser. Nos. 09/386,803; 09/386,610; 09/717,927; 09/113,727; and 09/823,948, all of which are herein incorporated in their entirety by reference. The use of different types of contact assemblies in the electroplating chambers 120*c* allows the processing tool 100 to plate different types of materials onto the workpieces. The electroplating chambers 120*c*, for example, can be used to plate copper in some of the electroplating chambers 120*c* and gold in other of the electroplating chambers 120*c*. Therefore, the integrated processing tool 100 can integrate electroprocessing chambers having different types of contact assemblies and different types of chemistries in the same tool for plating different types of materials onto wafers.

Figure 4:
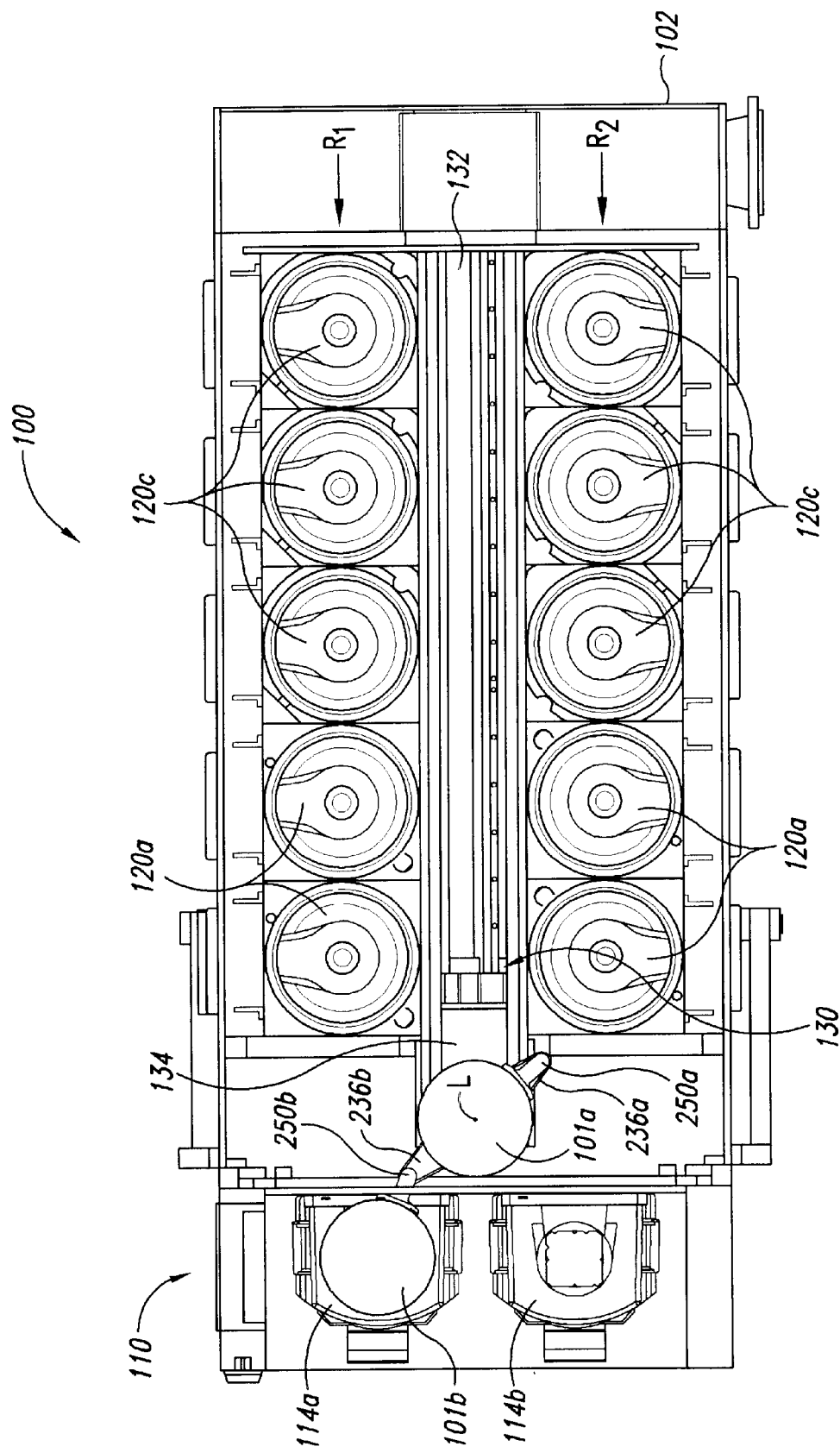
FIG. 4 is a top plan view of a processing apparatus for processing microelectronic workpieces showing another configuration of processing stations and a transfer device in accordance with another embodiment of the invention.
Figure 5:
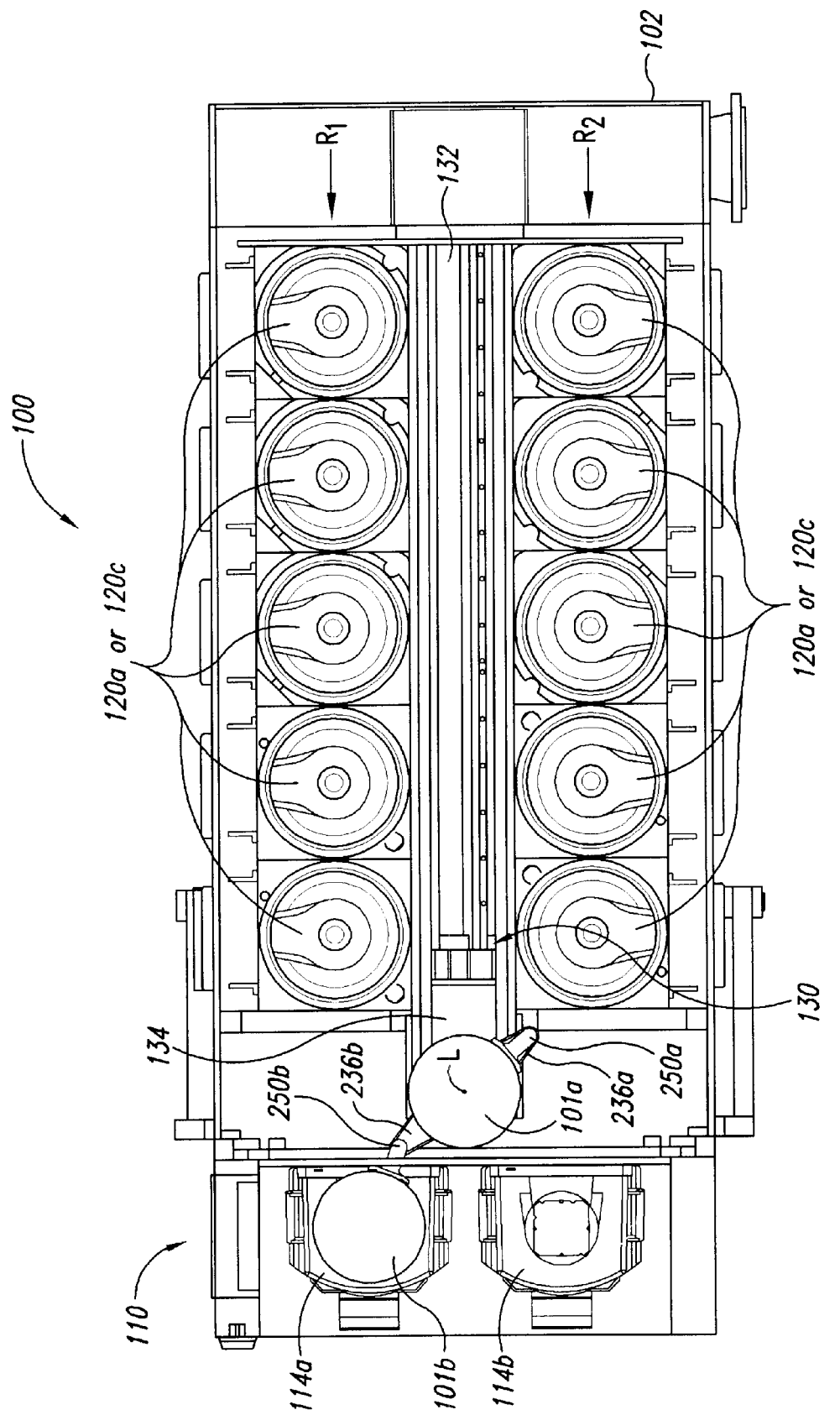
FIG. 5 is a top plan view of a processing apparatus for processing microelectronic workpieces showing still another configuration of processing stations and a transfer device in accordance with another embodiment of the invention.

FIGS. 4 and 5 illustrate alternate embodiments of the integrated processing apparatus 100. FIG. 4 illustrates the integrated processing apparatus 100 having four cleaning chambers 120*a* proximate to the load/unload station 110 and six electroplating chambers 120*c* downstream from the cleaning chambers 120*a*. The process flow for this embodiment of the integrated processing apparatus 100 includes removing workpieces 101 from the in-WIP 114*a* and placing the workpieces in the electroplating chambers 120*c*. Each workpiece 101 is individually placed in a single electroplating chamber 120*c*. After each electroplating procedure has finished, the robot unit 134 removes a plated workpiece 101 from the electroplating chamber 120*c* and places it in a vacant cleaning chamber 120*a*. The embodiment of the integrated processing apparatus 100 shown in FIG. 4 has more electroplating chambers 120*c* than cleaning chambers 120*a* because the electroplating processes may take longer than the cleaning/etching procedures. Consequently, to equalize the throughput of plated wafers through the electroplating chambers 120*c* with those through the cleaning chambers 120*a*, the integrated apparatus 100 can include more electroplating chambers 120*c* than cleaning chambers 120*a*. It will be appreciated that alternate embodiments can have a one-to-one correspondence of electroplating chambers and cleaning chambers in applications in which the electroplating cycles takes approximately the same time as the cleaning cycles, or that the integrated apparatus 100 can have more cleaning chambers 120*a* than electroplating chambers 120*c* for processes in which the cleaning cycles take longer than the electroplating cycles. FIG. 5 illustrates an alternate embodiment in which all of the processing chambers 120 in the integrated processing apparatus 100 are either cleaning chambers 120a or electroplating chambers 120c. For example, the tool can include only the CAPSULE™ type chambers that can perform single or dual side processing with bevel and edge processing capabilities.

The configuration of the processing stations 120a in the integrated processing tool 100 is designed to enhance the usage of the robot unit 134 so that it handles the workpieces 101 in an efficient manner. For example, the processing stations that perform the initial procedures for processing the workpieces are typically located toward the end of the track 132 away from the load/unload station 110. The processing stations 120 that perform the final procedures for processing the workpiece can be located adjacent, or at least proximate, to the load/unload station 110. The robot unit 134 can accordingly place a finished workpiece 101 in the out-WIP 114b and then pickup a new workpiece 101 from the in-WIP 114a without significantly changing the position of the robot unit 134 along the track 132. This provides for an efficient use of the capacity of the robot unit 134 because it does not need to translate along the track 132 for a great distance without carrying one of the workpieces 101 to one of the processing stations 120.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. An integrated tool for processing microelectronic workpieces, comprising:
   a cabinet defining an interior enclosure;
   a first single-wafer processing station in the enclosure configured to perform a procedure on an individual workpiece;
   a second single-wafer processing station in the enclosure configured to perform a procedure on the individual workpiece;
   a robot unit in the enclosure, the robot unit including—
      a transport unit configured to move within the interior enclosure;
      an arm assembly carried by the transport unit, the arm assembly including a waist member and an arm, wherein the waist member is operatively coupled to the transport unit to move along a lift path and to rotate about the lift path, and the arm has a fixed-length section projecting directly from the waist member;
      a first end-effector connected directly to a first pivot point along the fixed-length section of the arm;
      a second end-effector connected directly to a second pivot point along the fixed-length section of the arm, wherein the first and second end-effectors (a) rotate relative to the arm about at least one rotation axis generally parallel to the lift path and (b) are each configured to hold a microelectronic workpiece;
   a linear track in the enclosure; and wherein—
      the transport unit is carried by the track to move along the track within the interior enclosure;
      the lift path along which the arm moves is transverse to the track;
      the first pivot point about which the first end-effector rotates is along a first rotation axis at one end of the arm; and
      the second pivot point about which the second end-effector rotates is along a second rotation axis at another end of the arm, and the first and second end-effectors rotate independently of each other and the arm so that each of the first and second end-effectors can load/unload workpieces from the first and second processing stations.

2. An integrated tool for processing microelectronic workpieces, comprising:
   a cabinet defining an interior enclosure;
   a first single-wafer processing station in the enclosure configured to perform a procedure on an individual workpiece;
   a second single-wafer processing station in the enclosure configured to perform a procedure on the individual workpiece;
   a robot unit in the enclosure, the robot unit including—
      a transport unit configured to move within the interior enclosure;
      an arm assembly carried by the transport unit, the arm assembly including a waist member and an arm, wherein the waist member is operatively coupled to the transport unit to move along a lift path and to rotate about the lift path, and the arm has a fixed-length section projecting directly from the waist member;
      a first end-effector connected directly to a first pivot point alone the fixed-length section of the arm; and
      a second end-effector connected directly to a second pivot point alone the fixed-length section of the arm, wherein the first and second end-effectors (a) rotate relative to the arm about at least one rotation axis generally parallel to the lift path and (b) are each configured to hold a microelectronic workpiece; and
   wherein—
      the arm includes a medial section fixedly attached to the waist member to move the arm with the waist member, a first fixed extension projecting from one side of the medial section, and a second fixed extension projecting from another side of the waist member;
      the first end-effector is rotatably attached to the first extension and rotates about a first rotation axis at least generally parallel to the lift path; and
      the second end-effector is rotatably attached to the second extension and rotates about a second rotation axis at least generally parallel to the lift path.

3. An integrated tool for processing microelectronic workpieces, comprising:
   a cabinet defining an interior enclosure;
   a first single-wafer processing station in the enclosure configured to perform a procedure on an individual workpiece;
   a second single-wafer processing station in the enclosure configured to perform a procedure on the individual workpiece;
   a robot unit in the enclosure, the robot unit including—
      a transport unit configured to move within the interior enclosure;
      an arm assembly carried by the transport unit, the arm assembly including an arm operatively coupled to the transport unit to move along a lift axis and to rotate about the lift axis;
      a first end-effector carried by the arm; and
      a second end-effector carried by the arm, wherein the first and second end-effectors rotate relative to the arm about at least one rotation axis generally parallel to the lift path, wherein:
the arm assembly further comprises a waist member projecting from the transport unit and extending along the lift axis, the waist member being movable along the lift axis and rotatable about the lift axis, and the arm including a medial section fixed to the waist member, a first extension having a fixed-length section projecting from one side of the medial section, and a second extension having a fixed-length section projecting from another side of the waist member;

the first end-effector is connected directly to a first pivot point along the fixed-length section of the first extension of the arm at a first elevation relative to the arm and rotates about a rotation axis at least generally parallel to the lift path such that the first end-effector can be positioned over the lift axis in a first plane; and the second end-effector is connected directly to a second pivot point along the fixed-length section of the second extension of the arm at a second elevation relative to the arm and rotates about a rotation axis at least generally parallel to the lift path such that the second end-effector can be positioned over the lift axis in a second plane spaced apart from the first plane.

4. An integrated tool for processing microelectronic workpieces, comprising:

a cabinet defining an interior enclosure;

a first single-wafer processing station in the enclosure configured to perform a first procedure on an individual workpiece;

a second single-wafer processing station in the enclosure configured to perform a second procedure on the individual workpiece;

a track in the enclosure;

a robot unit in the enclosure, the robot unit including—
a transport unit carried by the track to move along the track within enclosure;
an arm assembly including a waist member and an arm operatively coupled to the transport unit to move along a lift path and to rotate about the lift path, wherein the lift path is transverse to the track and the arm has a fixed-length section projecting directly from the waist member;
a first end-effector and a second end-effector, the first and second end-effectors being rotatably connected directly to at least one pivot point along the fixed-length section of the arm to rotate about at least one rotation axis that is at least generally parallel to the lift path, wherein the first end-effector rotates through a first plane at least generally parallel to the arm and the second end-effector rotates through a second plane at least generally parallel to the arm, and wherein the first plane is spaced apart from the second plane and
wherein—
the arm assembly further comprises a waist member projecting from the transport unit and extending along the lift path, the waist member being movable along the lift path and rotatable about the lift path, and the arm including a medial section attached to the waist member, a first extension projecting from one side of the medial section, and a second extension projecting from another side of the waist member;

the first end-effector is carried by the first extension and rotates about a first rotation axis that is at least generally parallel to the lift path; and the second end-effector is carried by the second extension and rotates about a second rotation axis that is at least generally parallel to the lift path.

5. An integrated tool for processing microelectronic workpieces, comprising:

a cabinet defining an interior enclosure;

a plurality of cleaning chambers in the enclosure, the cleaning chambers being configured to individually rinse single workpieces during independent cleaning cycles;

a plurality of electroplating chambers in the enclosure, the electroplating chambers being configured to individually deposit a plated layer onto the individual workpieces during independent plating cycles;

a robot unit in the interior enclosure, the robot unit including—
a transport unit in the housing, the transport unit being configured to move alone a transport path;
an arm assembly including a waist member and an arm, wherein the waist member is operatively coupled to the transport unit to move alone a lift path and to rotate about the lift path, the lift path is transverse to the transport path, and the arm includes a fixed-length section fixed to the waist member;
a first end-effector and a second end-effector, the first and second end-effectors being rotatably connected directly to at least one pivot point along the fixed-length section of the arm to rotate about at least one rotation axis at least generally parallel to the lift path, wherein the first end-effector is attached to a first pivot point alone the arm and the second end-effector is attached to a second pivot point along the arm; and
wherein—
the arm further comprises a medial section attached to the waist member, a first extension projecting from one side of the medial section, and a second extension projecting from another side of the waist member;
the first end-effector is carried by the first extension and rotates about a first rotation axis that is at least generally parallel to the lift path; and
the second end-effector is carried by the second extension and rotates about a second rotation axis that is at least generally parallel to the lift path.

6. An integrated tool for processing microelectronic workpieces, comprising:

a cabinet defining an interior enclosure;

a plurality of cleaning chambers in the enclosure, the cleaning chambers being configured to individually rinse single workpieces during independent cleaning cycles;

a plurality of electroplating chambers in the enclosure, the electroplating chambers being configured to individually deposit a plated layer onto the individual workpieces during independent plating cycles;

a robot unit in the interior enclosure, the robot unit including—
a transport unit in the housing, the transport unit being configured to move along a transport path;
an arm assembly including a waist member and an arm, wherein the waist member is operatively coupled to the transport unit to move along a lift path and to rotate about the lift path, the lift path is transverse to the transport path, and the arm includes a fixed-length section fixed to the waist member;

a first end-effector and a second end-effector, the first and second end-effectors being rotatably connected directly to at least one pivot point alone the fixed-length section of the arm to rotate about at least one rotation axis at least generally parallel to the lift path, wherein the first end-effector is attached to a first pivot point alone the arm and the second end-effector is attached to a second pivot point alone the arm; and wherein— the arm further comprises a medial section attached to the waist member, a first extension projecting from one side of the medial section, and a second extension projecting from another side of the waist member;

the first end-effector is carried by the first extension at a first elevation relative to the arm and rotates about a first rotation axis that is at least generally parallel to the lift path such that the first end-effector rotates in a first plane; and the second end-effector is carried by the second extension at a second elevation relative to the arm and rotates about a second rotation that is at least generally parallel to the lift path such that the second end-effector rotates in a second plane spaced apart from the first plane.

7. An integrated tool for processing microelectronic workpieces, comprising:

a cabinet defining an interior enclosure;

a first set of processing stations arranged in a first row along one side of the interior enclosure;

a second set of processing stations arranged in a second row along an opposing side of the interior enclosure;

a track in the interior enclosure, the track extending between the first and second sets of processing stations;

a robot unit in the interior enclosure, the robot unit including— a transport unit carried by the track to move along the track within the interior enclosure;

an arm assembly including a waist member and an arm operatively coupled to the transport unit to move along a lift path and to rotate about the lift path, wherein the lift path is transverse to the track and the arm has a fixed-length section fixed to the waist member;

a first end-effector connected directly to a first pivot point along the arm, wherein the first end-effector rotates relative to the arm about a first rotation axis; and a second end-effector connected directly to a second pivot point along the arm, wherein the second end-effector rotates relative to the arm about a second rotation axis spaced apart from the first rotation axis.

8. The tool of claim 7 wherein the first and second sets of processing stations comprise cleaning chambers.

9. The tool of claim 7 wherein the first set of processing stations comprises a first cleaning chamber and a first electroplating chamber, and the second set of processing stations comprises a second cleaning chamber and a second electroplating chamber.

10. The tool of claim 7 wherein the enclosure includes only a single robot unit and the robot unit only includes a single transport unit and a single arm.

11. The tool of claim 7, wherein the enclosure includes only a single robot unit and the robot unit only includes a single transport unit and a single arm, and wherein the first and second end-effectors can each load/unload a workpiece in any of the processing stations.

* * * * *

UNITED STATES PATENT AND TRADEMARK OFFICE
CERTIFICATE OF CORRECTION

PATENT NO.   : 6,749,390 B2
DATED        : June 15, 2004
INVENTOR(S)  : Daniel J. Woodruff et al.

It is certified that error appears in the above-identified patent and that said Letters Patent is hereby corrected as shown below:

Column 1,
Line 11, "IMPROVEDED" should be -- IMPROVED --;

Column 14,
Lines 27 and 29, "alone" should be -- along --;

Column 15,
Line 56, insert semicolon between "plane" and "and";

Column 16,
Lines 22, 25 and 35, "alone" should be -- along --;

Column 17,
Lines 5, 9 and 10, "alone" should be -- along --;

Signed and Sealed this

Twenty-first Day of September, 2004

JON W. DUDAS
*Director of the United States Patent and Trademark Office*